(12) United States Patent
O'Sullivan et al.

(10) Patent No.: US 7,518,529 B2
(45) Date of Patent: Apr. 14, 2009

(54) MONITORING DEVICE FOR A MEDIUM VOLTAGE OVERHEAD LINE

(75) Inventors: Charles Brendan O'Sullivan, County Limerick (IE); Michael Martin Quinlan, County Limerick (IE)

(73) Assignee: FMC Tech Limited, Limerick (IE)

( * ) Notice: Subject to any disclaimer, the term of this patent is extended or adjusted under 35 U.S.C. 154(b) by 530 days.

(21) Appl. No.: 10/543,827

(22) PCT Filed: Jan. 31, 2003

(86) PCT No.: PCT/IE03/00015

§ 371 (c)(1),
(2), (4) Date: Apr. 24, 2006

(87) PCT Pub. No.: WO2004/068151

PCT Pub. Date: Aug. 12, 2004

(65) Prior Publication Data

US 2006/0187074 A1 Aug. 24, 2006

(51) Int. Cl.
*H04Q 9/00* (2006.01)

(52) U.S. Cl. .............. 340/870.27; 702/65; 340/660; 340/870.16; 709/224; 324/127; 324/126; 324/522; 324/543

(58) Field of Classification Search ............ 340/870.17, 340/870.16, 870.27, 660, 661; 324/126, 324/127, 522, 543; 702/65, 69; 709/223, 709/224

See application file for complete search history.

(56) References Cited

U.S. PATENT DOCUMENTS 4,829,298 A    5/1989  Fernandez
5,565,783 A    10/1996 Lau et al.
6,956,364 B2 * 10/2005 Staats ..................... 324/126
7,006,010 B2 *  2/2006 Thomas et al. ......... 340/870.07
7,076,378 B1 *  7/2006 Huebner ..................... 702/69
7,105,952 B2 *  9/2006 Divan et al. ................ 307/98
7,158,012 B2 *  1/2007 Wiesman et al. ....... 340/538.16
7,187,275 B2 *  3/2007 McCollough, Jr. .......... 340/538
7,230,413 B2 *  6/2007 Zhang et al. ............. 324/117 R
7,248,158 B2 *  7/2007 Berkman et al. ............ 340/538
7,250,848 B2 *  7/2007 White, II ............... 340/310.11
7,336,202 B2 *  2/2008 Kawai et al. ........... 340/870.17

FOREIGN PATENT DOCUMENTS

FR    2671635 A    7/1992
WO    WO-95/29553 A    11/1995

OTHER PUBLICATIONS

Engelhardt et al., Transmission and Distribution Conference, 1996, Proceedings, 1996 IEEE Los Angeles, CA, USA, Sep. 15-20, 1996, New York, NY, USA, IEEE, US, Sep. 15, 1996, pp. 366-370.

* cited by examiner

*Primary Examiner*—Albert K Wong
(74) *Attorney, Agent, or Firm*—Birch, Stewart, Kolasch & Birch, LLP

(57) ABSTRACT

A monitoring device (1) for monitoring the electrical properties of a medium voltage overhead line (3) in a medium voltage network comprises three separate measurement sensors (2a, 2b, 2c), each being adapted for direct connection onto a medium voltage overhead line. Each of the measurement sensors has means to draw operating power from the medium voltage overhead line. The measurement sensors measured results may be combined for accurate measurement analysis.

126 Claims, 5 Drawing Sheets

MONITORING DEVICE FOR A MEDIUM VOLTAGE OVERHEAD LINE

This invention relates to a monitoring device for monitoring the electrical properties of a medium voltage overhead line in a medium voltage network, the monitoring device comprising means to measure the electrical properties of the medium voltage line and means to communicate the measured electrical properties to a control centre computer of the medium voltage network.

Recently, deregulation of the electricity supply market has led to increased competition between electricity providers. It is now quite common for companies and households to have a choice of several different electricity providers when deciding on an electricity provider to supply their electricity needs. This has led to competition between the different providers over a whole range of different issues including pricing and quality of supply. Electricity providers are now having to supply their customers with less expensive electricity while still guaranteeing the same or improved quality of supply to their customers. In order to achieve these goals the electricity providers are having to improve the efficiency of their electricity networks. Furthermore, due to deregulation, network losses and interruption to electricity supply are now being penalised.

It has been found that even in highly developed countries, approximately 10% of all electricity generated is lost within the electricity networks themselves. This figure rises to almost 25% in less developed nations. One of the main reasons for this loss of power is the electricity provider's lack of knowledge of the electricity flowing in their medium voltage networks. Faults can go undetected for long periods of time and once detected are often difficult to locate over an expansive medium voltage network. By increasing their knowledge of the electrical properties in their medium voltage networks by closely monitoring their networks, electricity providers can significantly reduce the amount of electricity lost in their medium voltage networks and make considerable savings in the cost of generating the electricity. Furthermore, by closely monitoring their networks electricity providers will be in a better position to correct faults in their networks quickly with a minimum of inconvenience to their customers, thereby providing an improved quality of supply to their customers.

Heretofore, several attempts have been made to provide a monitoring device that will enable the electricity provider to closely monitor their medium voltage networks in a simple and cost effective manner. Two different types of monitoring devices have been developed for this purpose, pole mounted devices and line mounted devices. Generally speaking, the pole mounted device is mounted on the pole supporting the electricity lines a fixed distance from the lines that it is charged to monitor. Although simple to install, these devices are not entirely suitable due to the fact that it is extremely difficult to obtain an accurate reading of the electrical properties in the line when monitoring those properties from a distance. A key factor in tile accuracy of the calculation of the electrical properties, when using off line or pole mounted sensors, is the geometry of the sensor device in relation to the line that it is attempting to measure. In this instance, geometry means the spatial distance between the conductors, and the distance from the line arrangement to the sensor. This geometry information is difficult to obtain, time consuming, costly, and once the geometry is set, is subject to changes from environmental conditions, i.e. temperature of the line, sag, wind movement and subsidence of the poles whereon the device is mounted. These devices are therefore relatively inaccurate devices that cannot provide the required accuracy for monitoring a line and hence the medium voltage network sufficiently.

Line mounted devices are mounted directly onto the electrical line that must be measured. Although more difficult and expensive to install these allow for more accurate measurements of the electrical properties to be taken and more detailed monitoring of the line to be carried out. There are, however, problems associated with known types of line mounted monitoring devices. By having a single device the calculations on the line that may be carried out are limited. Impending earth faults are not detected and real time line loading information as well as reactive current information cannot be obtained from the single sensor. Furthermore, the ability to recognise reactive earth faults down to in the region of 1 Amp is not possible. Therefore, the required level of information cannot be obtained by using the known types of monitoring devices. In addition, these devices require an external power source such as electrochemical cells, solar cells, or conventional electrical power supply.

It is an object therefore of the present invention to provide a monitoring device for monitoring the electrical properties of a medium voltage overhead line in a medium voltage network overcomes at least some of the problems associated with known types of monitoring devices. It is a further object of the present invention to provide a system that can provide data on the distribution network over a wide geographical area in a cost effective way, and a system that will allow for greater segmentation of the network.

STATEMENT OF INVENTION

According to the invention, there is provided a monitoring device for monitoring the electrical properties of a medium voltage overhead line in a medium voltage network, the monitoring device comprising means to measure the electrical properties of the medium voltage line and means to communicate the measured electrical properties to a control centre computer of the medium voltage network, characterised in that
  the monitoring device comprises three separate measurement sensors, each measurement sensor being adapted for direct and electrically insulated connection onto a separate medium voltage overhead line;
  each measurement sensor having means to measure the electrical properties of its respective medium voltage overhead line; and
  each measurement sensor having means to communicate with at least one of the control centre computer and another measurement sensor, at least one of the measurement sensors having means to communicate with the control centre computer.

By having such a monitoring device, more accurate and detailed information relating to the medium voltage overhead line may be obtained. It is furthermore seen as an efficient device to accurately, monitor the electrical properties of the overhead line.

In one embodiment of the invention, the three measurement sensors further comprise a master sensor and two slave sensors, each of the slave sensors having means to communicate data to and from the master sensor and the master sensor having means to communicate with the control centre computer. This is seen as a useful embodiment of the monitoring device as the complexity of the communication circuitry is reduced.

In another embodiment of the invention, the master sensor further comprises a processor for processing data received from each of the slave sensors before transmitting electrical properties data onwards to the control centre computer. In this way, the processing of date may be carried out locally, reducing the burden of processing the information at the control centre.

In a further embodiment of the invention, each measurement sensor has means to communicate with the control centre computer.

In another embodiment of the invention, each measurement sensor has a processor for processing the measured electrical properties of its respective medium voltage overhead line. In this way, the processing of the information can be carried out in an even further distributed manner.

In one embodiment of the invention, there is provided means to synchronise the three measurement sensors. This will allow greater accuracy of measurements and facilitates the detection of faults in the overhead lines.

In another embodiment of the invention, each monitoring device has means to draw operating power directly from the magnetic field of the medium voltage overhead line. It is further envisaged that each measurement sensor has the means to draw operating power directly from the magnetic field of the medium voltage overhead line. The means to draw operating power directly from the magnetic field of the medium voltage overhead line comprises a magnetic field pick-up coil. By drawing operating power direct from the magnetic field of the medium voltage overhead line, the device may be powered directly from the line when current is flowing through the line. This is seen as a particularly beneficial way of operating each measurement sensor as additional power supplies will not have to be provided to power each measurement sensor.

In a further embodiment of the invention, each measurement sensor has means to draw operating power directly from the electric field of the medium voltage overhead line. The means to draw operating power directly from the electric field of the medium voltage overhead line comprises foil plates for electric field pickup. In this way, operating power may be drawn from the medium voltage overhead lines when current is not flowing in the overhead lines. In this way, when there is a fault on the line, the measurement sensor will still be able to report that there is a fault, in the absence of operating power being derived from the magnetic field of the medium voltage overhead line.

In one embodiment of the invention, each measurement sensor's means to measure the electrical properties of its associated medium voltage line further comprises a current measurement device. The current measurement device may comprise a Rogowshi coil. Alternatively, the current measurement device comprises a Hall effect device and in one embodiment the current measurement device comprises a current transformer constructed from a magnetically soft material.

In another embodiment of the invention, the current transformer further comprises means to draw operating power directly from the magnetic field of the medium voltage overhead line.

In a further embodiment of the invention, each measurement sensor has means to measure one or more of the instantaneous current ($I_c$), the peak current, ($I_{pk}$), the root-mean square (RMS) current, ($I_{RMS}$), the harmonic content of the current, and the phase of the current in its associated medium voltage overhead line. By having the capability to measure one or more of these properties, further information relating to faults on the line may be derived by the system administrators. A comprehensive overview of the network may be obtained.

In one embodiment of the invention, each measurement sensor has means to calculate the phase element of the peak current using the formula:

$$I_p = \frac{1}{N} \cdot \sum_0^N f(n) \cdot \cos(\omega_0 n)$$

In one embodiment of the invention, each measurement sensor has means to calculate the quadrature element of the peak current using the formula:

$$I_q = \frac{1}{N} \cdot \sum_0^N f(n) \cdot \sin(\omega_0 n)$$

In another embodiment of the invention, there is provided a monitoring device in which any three adjacent measurement sensors may be combined to form arbitrary triplets to form a monitoring device. In this way, any three adjacent measurement sensors may be used to, comprise a measurement device. This will allow various sections of the line to be measured at particular times and should one of the measurement sensors fail, the surrounding measurement sensors may still operate as part of a measurement device.

In a further embodiment of the invention, each measurement sensor has means to filter instantaneous current values and compare the instantaneous current values with peak current values for re-striking earth fault detection. Alternatively, each measurement sensor has means to compare the output of the sine/cosine functional block on a cycle by cycle basis with averaged values from the same source for detection of re-striking earth faults. Both of these are seen as useful ways of aiding in the detection or re-striking earth faults.

In one embodiment of the invention, one of the measurement sensor, has means to receive the measurements from the other two measurement sensors and based on thee received measurements and its own measured values has means to calculate one or more of the instantaneous balance current, $I_B$, the zero sequence current, $I_O$, and the ground current $I_G$. This will further allow a very comprehensive monitoring of the network to be carried out.

In another embodiment of the invention, the measurement device that has a means to receive the measurements from the other two devices further comprises means to perform one or more of the following operations:
  (a) measure the RMS value of $I_G$,
  (b) measure the amplitude and phase of $I_G$,
  (c) measure the harmonic content of $I_G$,
  (d) filter the $I_G$ signal,
  (e) compare $I_G$ to a predetermined set of thresholds,
  (f) determine the duration of an over-threshold condition and
  (g) generate and transmit a status report to the control centre.

In a further embodiment of the invention, each measurement sensor is provided with a slow discharge high capacitance capacitor to act as a temporary power supply. This is seen as a useful way of providing a temporary power supply, should there be a failure in the measurement sensors or their overhead lines are unable to provide them with sufficient operational power. In this way, communication to the control centre may be maintained for a limited period to indicate that a fault is occurring.

In one embodiment of the invention, the means to communicate with the control centre computer comprises a radio transmitter/receiver. This is seen as a simple and effective way of communicating with the control centre computer.

In another embodiment of the invention, the three measurement sensors further comprise a master sensor and two slave sensors, the mater sensor having means to communicate with the control centre, means to receive measurements from the slave sensors and a processor to process the measurements prior to transmission to the control centre. In this way, a great deal of the computation may be carried out in the master sensor and the construction of the two slave sensors may be simplified to reduce the overall cost of the system. This further reduces the computational overhead burden on the control centre computer.

In a further embodiment of the invention, the monitoring device is provided with means to operate remote switch gear. In this way, if a monitoring device reports a fault at the control centre computer, the control centre computer may instruct the monitoring device to operate remote switch gear to close a certain section of the network off.

In one embodiment of the invention, the power supply of each of the measurement sensors is provided wit a low loss full wave rectifier consisting of four transistors. This is seen as a useful and efficient way of providing low loss full wave rectifier for the circuitry which enables the measurement device to utilise the maximum amount of power derived from overhead fines. Furthermore, it is a simple and efficient rectifier to use, while remaining robust.

In another embodiment of the invention, each measurement sensor is provided with a shunt circuit to control the power being transferred to the measurement sensor. The shunt circuit may further comprise an auxiliary winding to facilitate shunting.

In a further embodiment of the invention, each measurement sensor samples the current flowing in its associated medium voltage line at a predetermined rate and there is provided means to synchronise the sampling rate of each of the three measurement sensors. In this way, by synchronising the sampling rate of earth of the three measurement sensors, highly accurate measurements may be obtained at each position in which there is a measurement device. This will allow for much smaller earth faults to be detected and other faults in the system to be detected. This greatly enhances the ability of administrators to manage the medium voltage overhead line network.

In one embodiment of the invention, the means to synchronise the sampling rate with the other measurement sensors comprises an analogue phase locked loop circuit. This is a very simple efficient way of synchronising the sampling rate of the measurement sensors. Alternatively, the means to synchronise the sampling rate with the other measurement sensors could comprise a digital phase locked loop circuit. This is also a very efficient and accurate way of synchronising the sampling, rate of the measurement sensors.

In another embodiment, the means to synchronise the sampling rate with the other measurement sensors comprises a radio borne time signal. This is a further simple and efficient way of synchronising the sensors.

In another embodiment of the invention, the means to synchronise the sampling rate of the other measurement sensors comprises a receiver on each of a pair of the measurement sensors to receive a transmitted synchronisation signal from the third measurement sensor.

In a further embodiment of the invention, there is provided a boost regulator to provide adequate power supply integrity for circuitry of each measurement sensor.

In one embodiment of the invention, there is provided a system for monitoring a medium voltage network comprising a plurality of medium voltage overhead lines, the system comprising a control centre computer and a plurality of remote monitoring devices distributed throughout the medium voltage network, each of the monitoring devices having means to measure the electrical properties of a medium voltage overhead line and means to communicate the measured electrical properties to the control centre computer characterised in that each monitoring device further comprises three measurement sensors each measurement sensor being mounted on a separate medium voltage overhead line to the other two measurement sensors and each measurement sensor having means to measure the electrical properties of its medium voltage line, each measurement sensor has communication means for communication with at least one of the control centre computer and another measurement sensor, and at least one of the measurement sensors having means to communicate with the control centre computer. This is seen as a particularly efficient system for monitoring a medium voltage overhead line of a medium voltage network The system will allow for highly accurate measurements to be carried out by having more accurate measurements of the medium voltage overhead network, minor faults may be handled in an efficient manner, thereby increasing the efficiency of the network.

In another embodiment of the invention, there are provided a plurality of Data Acquisition Communicators (DACs) intermediate the control centre computer and the plurality of monitoring devices, each Data Acquisition Communicator having a plurality of monitoring devices associated therewith so that electrical properties data sent from a monitoring device to the control centre computer is sent to the relevant DAC before being transferred from the relevant DAC to the control centre computer. By having a plurality of DACs, processing may be carried out either at the DACs or in the control centre computer. The signals may be amplified in the DAC and temporary storage of the data may be carried out in each DAC.

In a further embodiment of the invention, one of the measurement sensors further comprises a processor for processing the measured electrical signals from all three measurement sensors before transmitting the processed data to the control centre computer. In this way, the processing of the measured electrical signals will be carried out at each of the measurement sensors which reduces the computational overhead requirement of the control centre computer or DAC and further enhance the efficiency of the system.

In another embodiment of the invention, the DAC's are further provided with a processor to process the electrical properties data, prior to transmitting the data onwards to the control centre computer. In this way, the computation may be carried out in each of the DACs which will help in simplifying the construction of the individual measurement sensors.

In a further embodiment of the invention, electrical properties data is sent from the DAC to the control centre computer over a GSM link. This is an inexpensive and secure way of sending the data to the control centre computer.

In one embodiment of the invention, there are provided repeaters intermediate a DAC and one or more of its associated monitoring devices to amplify any communications to and from the DAC and the monitoring device. This will help to further reduce the individual cost of the communications units in each of the measurement sensors. It is envisaged that the repeaters may be stored in some of the measurement devices themselves which will save on the installation of the repeaters.

In another embodiment of the invention, a monitoring device may act as a repeater for another monitoring device in the system.

In a further embodiment of the invention, each of the measurement sensors is powered directly from the medium voltage line upon which it is mounted.

In a further embodiment of the invention, each measurement sensor has means to draw operating power directly from the magnetic field of the medium voltage overhead line.

In one embodiment of the invention, the measurement sensors has means to draw operating power directly from the electrical field of the medium voltage overhead line. By having a system in which the measurement sensors may draw operating power directly from the electrical field or the magnetic field of the line, each of the measurement sensors will not have to be supplied by additional power supplies. This will greatly increase the operational life of each of the measurement sensors and will reduce any maintenance work that has to be carried out on the sensors. This will further increase the cost effectiveness of the system.

In another embodiment of the invention, there is provided a system in which the measured electrical signals are processed and in which the phase element of the peak current is calculated using the formula:

$$I_p = \frac{1}{N} \cdot \sum_0^N f(n) \cdot \cos(\omega_0 n)$$

In a further embodiment of the invention, there is provided a system in which the measure electrical signals are processed and in which the quadrature element of the peak current is calculated using the formula:

$$I_q = \frac{1}{N} \cdot \sum_0^N f(n) \cdot \sin(\omega_0 n)$$

In one embodiment of the invention, there is provided a system in which any three adjacent measurement sensors may be combined to form arbitrary triplets to form a variety of detectors. This will increase the number of measurements that can be carried out on the overhead line and should one of the measurement sensors fall, the other two measurement sensors may form part of a different measurement device.

In one embodiment of the invention, there is provided a system in which instantaneous current values are filtered and compared with typical peak values of current and these values are transmitted to the DAC for re-striking earth fault detection. Alternatively, the output of the sine/cosine functional block is compared on a cycle by cycle basis with averaged values from the same source and the results of the comparison are transmitted to the DAC for defection of re-striking earth faults.

DETAILED DESCRIPTION OF THE INVENTION

The invention will now be more clearly understood from the following description of some embodiments thereof given by way of example only with reference to the accompanying drawings in which.

Figure 1:
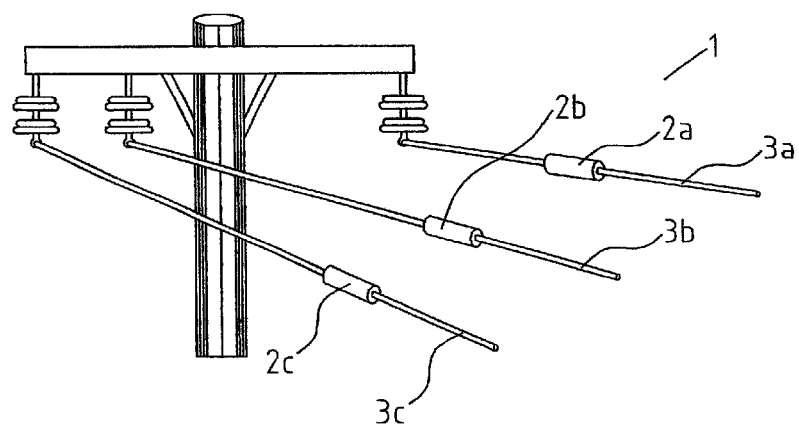
FIG. 1 is a perspective view of a monitoring device according to me invention.
Figure 2:
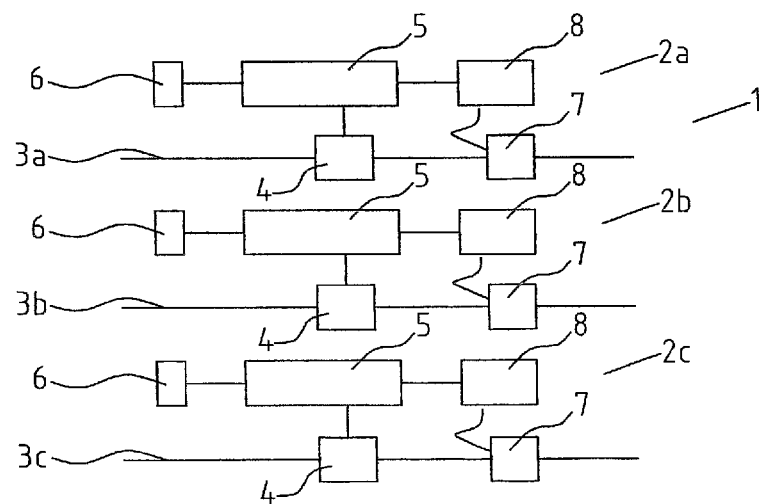
FIG. 2 is a block diagram of a monitoring device according to the invention.

Referring now to the drawings and initially to FIGS. 1 and 2 thereof there is shown a monitoring device for monitoring the electrical properties of a medium voltage overhead line in a medium voltage network, indicated generally by the reference numeral 1, comprising three separate measurement sensors 2a, 2b, 2c, each sensor being mounted directly on a separate medium voltage line 3a, 3b, 3c respectively. Each of the measurement sensors 2a, 2b, 2c further comprises means to measure the electrical properties of its respective medium voltage overhead line, in this case provided by a current transformer sensor 4 and a microcontroller 5, and means to communicate with at least one of the other measurement sensors, provided by dual mode RF transmitter 6. A power current transformer 7 connected to a power supply 8 are provided to power each of the individual measurement sensors 2a, 2b and 2c.

In use, current flowing through an overhead line will generate a magnetic field surrounding that line. The power current transformer 7 transforms this magnetic field into a voltage. This voltage is sensed by the power supply circuit 8 where it is rectified and regulated so that it is suitable for use with the circuitry of the microcontroller 5 and the transmitter receiver 6. Current flowing through the line will also be sensed by the current transformer sensor 4 and the microcontoller 6 will sample the current flowing through the line at a predetermined rate. The instantaneous current, $I_c$, the peak current $I_p$, the root mean square current, $I_{RMS}$, the harmonic content of the current, and the phase of the current of the associated medium voltage overhead line 3 are measured or calculated from measured results.

Once the appropriate values have been measured two of the measurement sensors, in this case 2a and 2c, send their measured values to a master measurement sensor, in this case 2b. On receiving the measured values from the other two measurement sensors the measured values are passed to the microcontroller 5 of the master measurement sensor 2b where they are combined with the measured values of the master measurement sensor to calculate one or more of the instantaneous balance current, $I_B$ the zero sequence current $I_O$, and the ground current $I_G$. The microcontroller 5 of the master measurement sensor 2b then performs one or more tasks of measuring the RMS value of $I_G$, measuring the amplitude and phase of $I_G$, measuring the harmonic content of $I_G$, filtering the $I_G$ signal, comparing $I_G$ to a predetermined set of thresholds, determining the duration of an over-threshold condition and generating a status report to be transmitted to a control centre (not shown) by the RF transmitter receiver 6.

Figure 3:
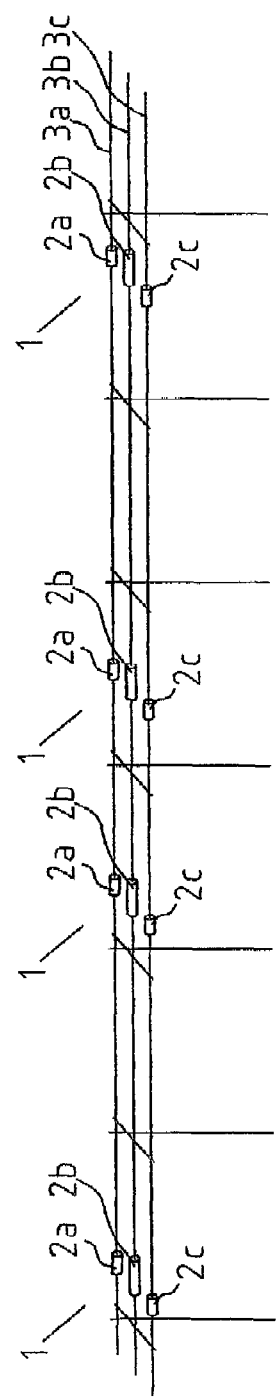
FIG. 3 is a perspective view of a length of medium voltage overhead line having a number of monitoring devices distributed thereon.

FIG. 3 of the drawings shows a number of monitoring devices distributed along a length of medium voltage line (3a, 3b, 3c). A monitoring device comprising a master measurement sensor 2b and a pair of slave measurement sensors 2a, 2c are positioned at each monitoring point along the length of the medium voltage line (3a, 3b, 3c). The distance chosen, in this case, between adjacent monitoring points is approximately 1 kilometre. Data relating to the current in each line will be measured and processed at each measurement point before being sent to the control centre computer (not shown) via a Data Acquisition Communicator (DAC) (not shown).

Figure 4:
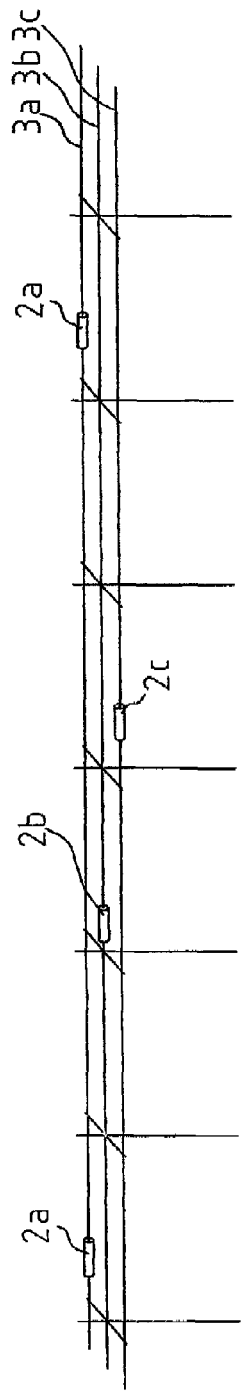
FIG. 4 is a perspective view of a length of medium voltage overhead line showing an alternative distribution of monitoring devices along the line.

Referring now to FIG. 4 of the drawings, there is shown an alternative distribution of the monitoring devices along the medium voltage lines. In this arrangement, the measured line parameters from each of the sensors are transmitted to the DAC unit. The DAC unit executes calculations on the received data to estimate the overall line state including out of balance current and variation of out of balance current along the length of the line. In this embodiment, at each monitoring point, only one measurement sensor of the monitoring device is provided. In this way, a single monitoring device is spread over a greater distance than before. A single measuring device (2a, 2b, 2c), is placed at a monitoring point and the measuring device and the line upon which it is placed are chosen in strict rotation. Depending on the line conditions and the distribution of branches and loads on the line, various combinations of sensors can be used to implement a measuring device. (2a, 2b, 2c) is one combination of sensors that may be used to implement a measuring device, whereas (2b, 2c, 2a') is a second combination and, further, (2c, 2a', 2b') is a third combination.

Figure 5:
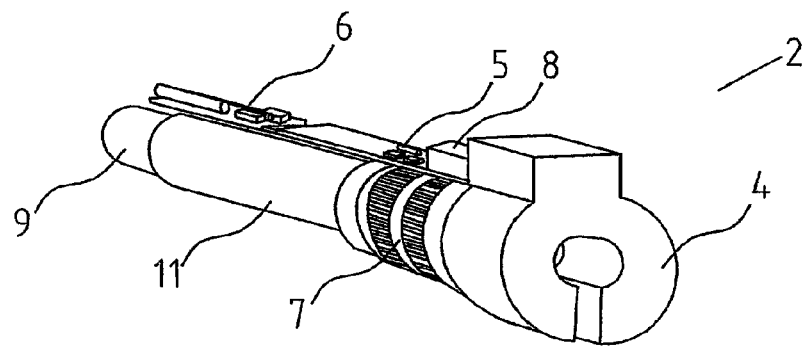
FIG. 5 is a perspective partially cut-away view of a measurement sensor according to the invention.

Referring now to FIG. 5 of the drawings there is shown a sectional view of a measurement sensor where like parts have been given the same reference numerals as before. The measurement sensor consists of a cylindrical body portion having a number of layers and sections contained therein. An inner insulation layer 9 is provided to electrically isolate the measurement sensor from an electric line (not shown). Foil plates 11 are provided for electrical field pickup. By having the foil plates the electrical field can be used to produce a voltage by capacitively coupling to the conductor. This electrical field may be used to provide sufficient power to operate the radio transmitter receiver 6 to signify to the control centre computer that the line is indeed live although no current is flowing in it. The voltage signal on the foil plates may be used to estimate potential difference between the conductors. The next outermost layer comprises a magnetic field pickup coil which acts as the power current transformer 7 and provides power to the device when sufficient current is flowing in the line. Finally, a current sensing coil 4 along with the circuitry for the radio transmitter receiver 6 and power supply 8 form the outermost layers.

Figure 6:
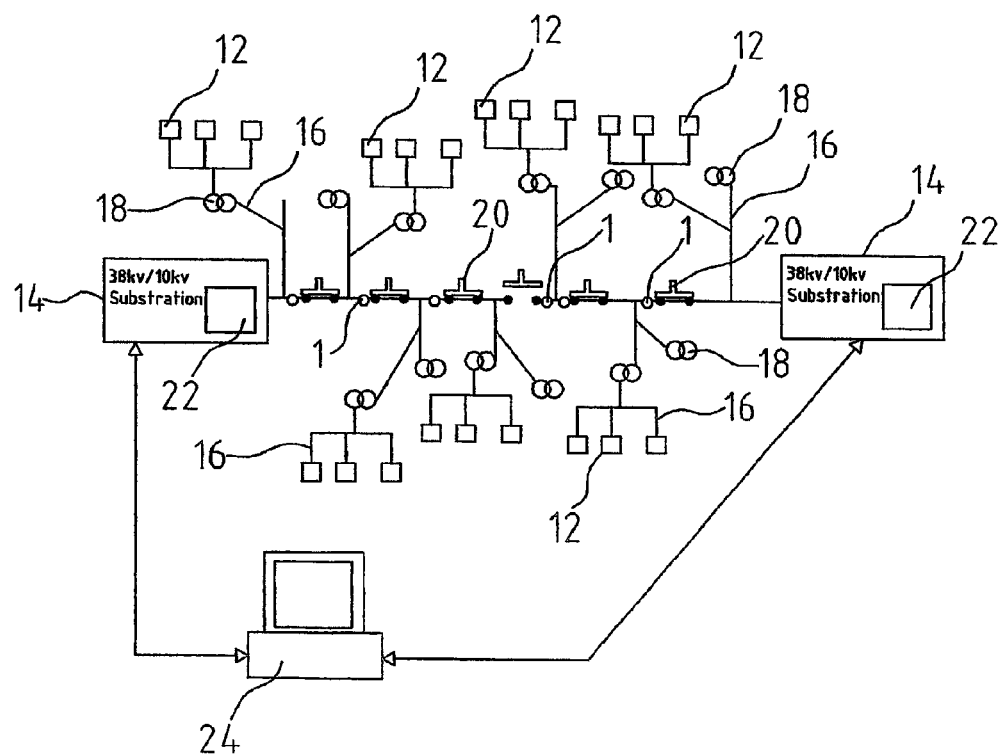
FIG. 6 is a diagrammatic view of a system according to the invention.

Referring now to FIG. 6 of the drawings there is shown a block diagram of a typical medium voltage electrical network incorporating, the system according to the invention. The network comprises a plurality of customers 12 connected to substations 14 via medium voltage lines 16. Localised transformers 18 are provided on the lines 16. A plurality of monitoring devices 1 are positioned along the lines as are a plurality of sectionalising switches 20. There is further provided a Data Acquisition Communicator (DAC) 22 in each substation 14 which in turn is connected to a control centre computer 24.

In use, the monitoring devices measure the currant flowing in the lines in the medium voltage network to which they are connected. The measured current data is sent from one of the measurement sensors (not shown) of each monitoring device to a DAC 22 in a substation, 14 after which it is passed onwards to the control centre computer 24 for analysis. If a fault has occurred on one of the lines the control centre computer can send control Instructions to the monitoring device that notified the control centre of the fault, via the DAC 22, to operate one of the sectionalising switches 20. The control instructions may be to open the switch and redirect electricity along a different path in the network.

Figure 7:
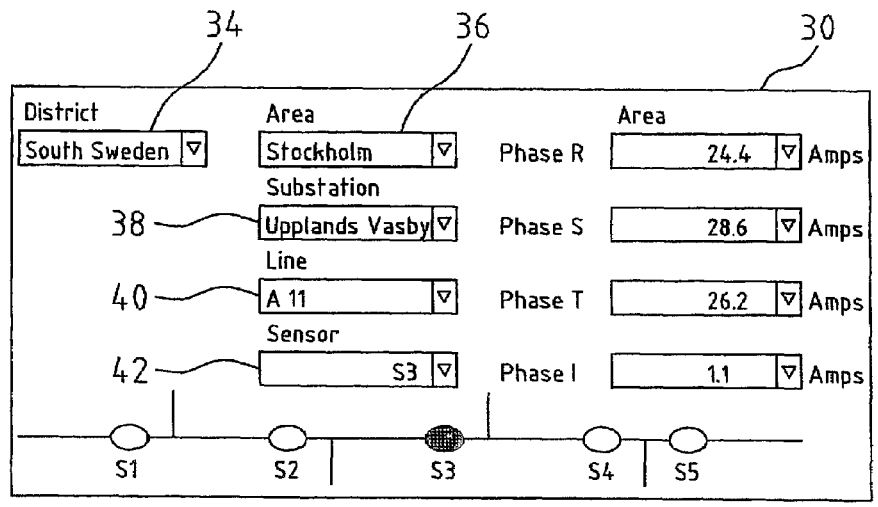
FIG. 7 is a typical view of a user interface of the control centre computer.
Figure 8:
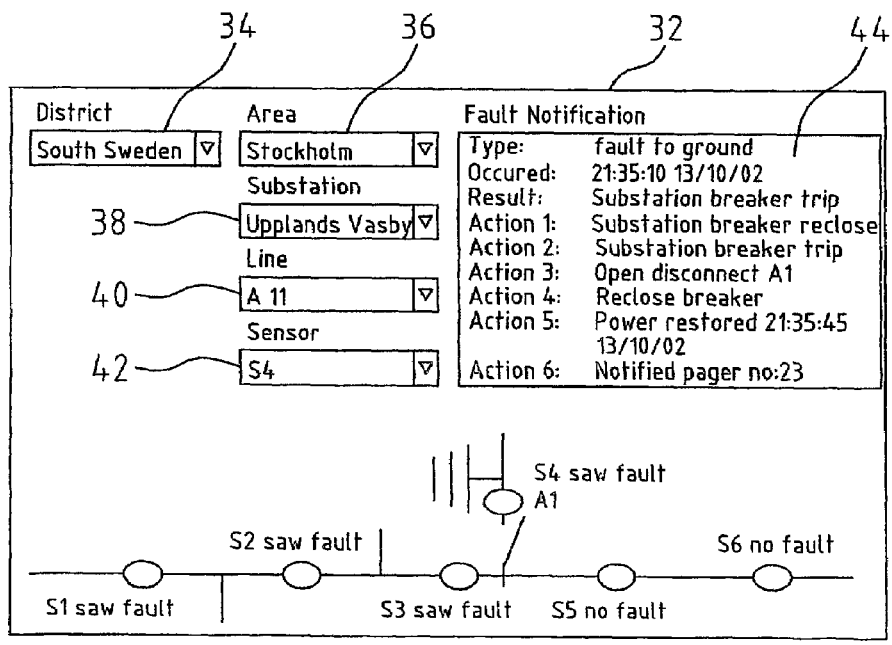
FIG. 8 is a view of a user interface of the control centre computer with automated switching gear operated by the system.

Referring now to FIGS. 7 and 8 of the drawings there is shown various graphical user interfaces 30, 32 of the control centre computer forming part of the system. When a fault occurs along one of the lines the user is shown the district, area, the substation and the line in which the fault occurred as well as the monitoring device that experienced the fault in pop-up boxes 34, 36, 38, 40 and 42 respectively. In FIG. 7 the value of the currents on each of the three lines as well as the fault current are displayed to the system operator. The operator may then choose to take action and send repair personnel to the exact spot in which the fault is occurring. In this way, the repair personnel will be able to find the fault in a quick and efficient manner in the minimum amount of time. FIG. 8 shows the graphical user interface system when an automatic line repair system is in operation. Again the system user is shown the area is which the fault has occurred and is also shown the log of actions taken to rectify the fault in fault notification dialogue box 44. In the example shown fault notification dialogue box indicates that there was a fault to ground adjacent monitoring device S4. As a result of the fault a substation breaker was tripped and an attempt was made to re-close the substation breaker. The substation breaker was tripped again and a disconnect A1 was opened to disconnect this section of the line from the network temporarily until the fault can be repaired so that the remainder of the network can continue to operate in a normal manner. The breaker was re-closed again and power was restored some 35 seconds later. Finally, a repair person was notified of the fault from the control centre by alerting their pager.

Figure 9:
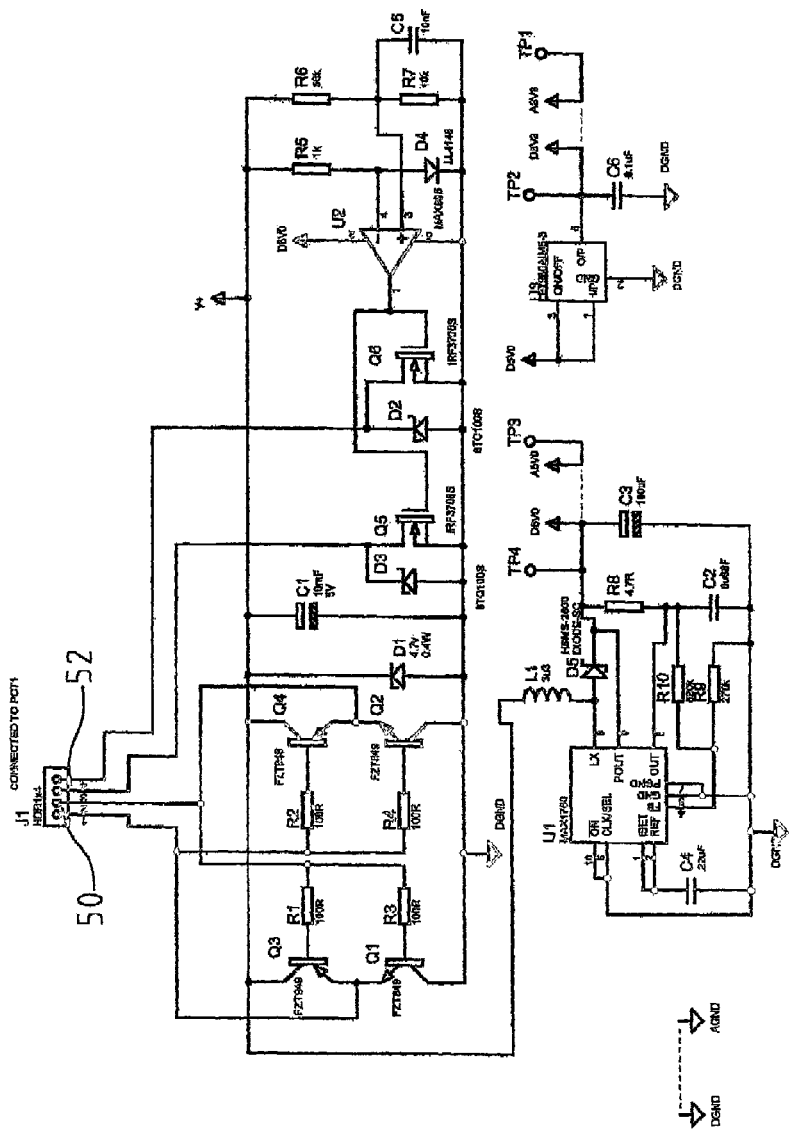
FIG. 9 is a circuit schematic of the power supply of each measurement sensor.

Referring now FIG. 9 of the drawings there is shown a circuit schematic of the power supply of a measurement sensor. Input power is derived from a current transformer winding 50. The input power is fed to the transistor network Q1, Q2, Q3 and Q4. The transistor network forms a very low loss full wave rectifier. The voltage on winding 50 is alternating at the mains frequency (50 or 60 Hz). Initially the voltage from winding 50 is such that the voltage on Q3 emitter is positive and the voltage on Q2 emitter is negative. Current flows into the emitter of Q3 which saturates allowing the voltage present on the emitter to appear, with a negligible voltage drop, on Q3 collector. This then feeds the reservoir capacitor C1. Similarly, current flows out of Q2 emitter and, as Q2 is in saturation, it passes the emitter voltage to the collector.

This then forms the return path from the reservoir capacitor C1. Resistors R1 and R4 are chosen to allow sufficient base drive to ensure saturation of the transistors. When the polarity on winding 50 reverses, transistors Q1 and Q4 become active while transistors Q2 and Q3 become inactive. Otherwise the circuit operation is identical to that described above. In this way a rectified DC voltage appears across capacitor C1 with minimum voltage drops between it and the output of winding 50.

Because the power supply has to operate over a large line current range the current transformer output voltage will be excessively high at the highest line current for a set-up that ensures adequate power transfer at the minimum line currents. For this reason a shunting circuit is provided that diverts the energy in the current transformer away from the power supply. This is done, by short-circuiting an auxiliary winding when the voltage across capacitor C1 exceeds a certain limit.

If the voltage 'seen' by comparator U2 pin 3 exceeds the threshold set by resistor R5 and diode D4 then it will activate MOSFET transistors Q5 and Q6. In this situation winding 52 now 'sees' a short consisting of diode D3 and the transistor Q6 in one current direction or diode D2 and transistor Q5 in the other. In this way the voltage across capacitor C1 is limited to a manageable value. Diode D1 provides additional protection against very fast power-line transition that the shunting system may not be able to cope with.

The resulting DC voltage across capacitor C1 can vary widely for different line current conditions. In the case of the present implementation it can vary anywhere between 0.7V and the shunting level of around 4V. Further regulation is required to provide adequate power supply integrity for the remainder of the line monitoring unit. A boost regulator, U1, is used for this purpose. This provides a constant 5V across capacitor C4.

It will be understood that synchronisation between the units can be achieved using low power radio, transmitter receiver pairs. The master measurement sensor can transmit a pulse that triggers a sample of the analogue to digital converter in both slave measurement sensors. Delays can be introduced to minimise queuing of sampling. In this way the sensor can be synchronised locally to a fine time tolerance so that accurate calculations can be carried out. Furthermore, it will be understood that instead of using a magnetically soft material for the current sensing coil a Rogowski coil could be used or a Hall effect device could be used to adequate effect. It may further be possible to use a single transformer for the current sensing and for powering the device although this may effect the accuracy of the system.

In order to obtain useful fault information from the medium voltage overhead lines, the current signal of each line 3a, 3b and 3c is measured before being combined with the current signal of the other two lines. This will enable the calculation of the zero sequence current, $I_o$. The phase of the current signal of each line is also measured. By having phase information, a more accurate analysis of which line is experiencing a fault is achieved. The phase of the zero sequence current may be compared with the phase of the zero sequence voltage and whether the two phases are a fixed amount out of step with each other, which will indicate whether a line is experiencing a fault The zero sequence voltage is measured by applying an open delta transformer to the busbar of the substation. The zero sequence voltage data may then be sent to the DAC or to each of the monitoring devices or wherever the comparison calculations are to be carried out. For example, if the phase difference between the open delta voltage and the zero sequence current is below a certain predetermined level, say 80°, then there is a fault in the line. However, if the phase difference is greater than 80°, then it is known that the line is operating normally. The fault/no fault phase relationship is dependent on details of the line feed at the substation and the lumped and/or distributed capacitances of the line. Line feed parameters that may vary include the presence or absence of a Petersen coil and the values of that coil.

Having accurate phase information is particularly important when there is a spur in the medium voltage network. Previously, using complex techniques in the substation, it was possible to determine on which line a fault was occurring. If there was a spur present on that line in the network, there was no way of determining on which part of the line, after the spur, the fault had occurred on. Therefore, a great deal of additional funds would be wasted in finding the fault. By having phase information, the fault information will be more accurate in that the individual spur upon which the fault is occurring will be clearly indicated. Another advantage of having the three measurement sensors mounted directly on the line is that much more accurate phase measurements may be obtained. This, coupled with accurate timing synchronisation, enables greater flexibility in the number of calculations that can be carried out.

In order to measure the current accurately the measurement sensor is synchronised to the mains frequency. The current signal is then sampled an integral number of times per cycle of the mains signal. The samples are multiplied by Sine and Cosine functions at the mains frequency. The Sine and Cosine products are integrated over an integral number of cycles. From Fourier series theory, the result of the integration will be zero for all harmonics in the signal except for this fundamental which will be:

$$F(x) = \sum_{n=1}^{\infty} (An\cos(nWot) + Bn\text{Sin}(nWot))$$

As random noise does not correlate to the mains current it will appear as a perturbation on the numerical integration. If the current is summed over an integral number of cycles then the noise will be attenuated while the current signal will be reinforced. Sine and Cosine function correlation will give the phase and quadrature measurements. The polar representations of these signals give amplitude and phase.

By measuring the current at a single frequency, further significant advantages arise. The computational overhead on each of the processors is much reduced and the noise rejection of the devices is particularly good. This further facilitates carrying out the calculations. A significant amount of filtering of the device is carried out. Every sample, taken is compared to the 50 Hz signal. Noise is filtered out cycle by cycle. The fluctuations in the current are correlated to the 50 Hz signal and the line current peak and ground fault peaks are simultaneous which aids detection.

The current calculations and data processing will now be described in more detail. The measurements obtained by the monitoring devices comprise mainly of the amplitude and the phase of the fundamental harmonic of the line current. This may be expressed in simple mathematical notation as follows:

$$I = Io \cdot \sin(\omega_0 t + \theta)$$

$$\omega_0 = 50 \cdot 2 \cdot \pi$$

$$\theta = \text{phase}$$

$$I_0 = \text{peak current.}$$

This may also be expressed in complex notation as follows:

$$I = I_0 \cdot e^{j(\omega_0 t + \theta)}$$
$$= I_0 \cdot e^{j\omega_0 t} \cdot e^{\theta}$$
$$= (I_p + j \cdot I_q) \cdot e^{j\omega_0 \cdot t}$$

where $I_p$=phase element of the peak current and $I_q$=quadrature element of the peak current.

Standard Fourier Series principles may be applied to calculate the values of $I_p$ and $I_q$.

The standard complex form of Fourier Series may be written as:

$$D_n = T^{-1} \int_0^T f(t) \cdot e^{(-j \cdot n \cdot \omega_0 \cdot t)}$$

$$D_1 = (I_p + j \cdot I_q)$$

$$I_p = T^{-1} \cdot \int_0^T f(t) \cdot \cos(\omega_0 t)$$

$$I_q = T^{-1} \cdot \int_0^T f(t) \cdot \sin(\omega_0 t)$$

These Integrations are performed numerically giving:

$$I_p = \frac{1}{N} \cdot \sum_0^N f(n) \cdot \cos(\omega_0 n)$$

$$I_q = \frac{1}{N} \cdot \sum_0^N f(n) \cdot \sin(\omega_0 n)$$

where N=the number of samples per period
n=the sample number, and
f(n)=the analogue to digital converter (ADC) reading.

By using the above equations, the second and subsequent higher harmonics over a full period, sum to zero. The integration of the product of the random noise and a sine or cosine function sums to zero, as the number of samples gets larger. The number of cycles used will be in the order of 10 to 50 cycles to estimate values for $I_p$ and $I_q$. These values may then be sent to the DAC or the control centre computer at the end of each integration period.

Re-striking earth faults are earth faults that display a high level of intermittency, non-linearity and time variance. Re-striking earth faults can have several causes which include insulator breakdown and ingress of moisture into cable systems. Earth faults of this type can have a short duration, in the order of less tan 10 mS, and can occur infrequently. The earth fault may be observed on the majority of cycles or only on a small fraction of cycles. Because of the foregoing, re-striking earth faults are difficult to detect by conventional means. The sensors described herein use one or more of the following techniques to reliably identify re-striking earth faults:

(a) The instantaneous current readings are filtered by recursive or non-recursive digital filters to reduce noise and improve signal integrity. Where the filtered readings exceed the ambient readings by a defined margin, the time is noted (cycle count) and an event flag is set. The information is transmitted by the sensor to the DAC Unit where it is correlated with the other sensor data to identify that a re-striking fault occurred and determine the location of the fault (b) The output of the sine/cosine correlation is monitored on a cycle-by-cycle basis and where values exceed the ambient level by a defined margins, the time is noted (cycle count) and an event flag is set. This information is transmitted by the sensor to the DAC unit where it is correlated with the other sensor data to identify that a re-striking fault occurred and determine the location of the fault.

Data is communicated on a 10 kHz bi-phase carrier. This carrier is harmonically locked to the mains frequency using a phase locked loop circuit in the substation based DAC system. The communications carrier, in conjunction with the data packet is used to "lock" the line units in time to the period of the mains voltage: all units are therefore synchronised in normal operation. This ensures that the relative amplitudes of the measured currents: $I_p$ and $I_q$ reflect the phase information of the line current.

The DAC system receives the $I_p$, and $I_q$ signals from all operational sensors. In addition the system receives open delta voltage signals. Processing of the data at the DAC uses the following algorithms and formulae.

Sensor currents:—$I_1$, $I_2$ & $I_3$

All quantities are complex numbers.

ZeroSequenceCurrent=$I_o$=$\Sigma I_1 + I_2 + I_3$

OpenDeltaVoltage=$V_{o\Delta}$

Mod $V_{o\Delta}$=|$V_{o\Delta}$|

Arg $V_{0\Delta}$=Angle of $V_{o\Delta}$

Mod $I_o$=|$I_o$|

Arg $I_o$=Angel of $I_{o\Delta}$

The above define the available information for each of the monitored lines. The fundamental DAC fault detection algorithm can be summarized by the following pseudo code. This significantly simplifies and reduces the computation overhead.

$$\left\{ \text{If Mod } I_o \geq ZeroSequenceMax \right.$$

AND $$ArgMin < Arg\left(\frac{V_{o\Delta}}{I_0}\right) < ArgMax \Big\}$$

*LineFaulty* = True

Else

*LineFault* = False

In other words, the current from the three line sensors in summed using complex arithmetic. If a fault condition exists on a line we expect to see an out of balance current greater than a defined minimum value. As both healthy and faulty line are expected to see nonzero currents, the relative phases of the zero sequence current and the open delta voltage will be tested. If the relative phase is greater than or less than defined limits then that line is faulty. Further, if the relative phases are outside the defined limits then the line is not faulty even though the zero sequence is non zero.

Three phase systems typically have several lines being fed from a single transformer, lines will typically carry high levels of reactive current and it is necessary to relate both the phase and amplitude of ground currents to the voltage developed by open delta transformer.

In one embodiment the three units may be synchronised. Preferably, the units are synchronised off the communication signal. The line currents phase and amplitude are measured in each of the units separately. The slaves then transmit these values periodically to the master unit where the master unit then estimates the amplitude and phase of the ground current. By using this method computation overhead on the master measurement sensor will be reduced and it will allow for an efficient processing of the information.

It will be understood that although in the embodiments described, there is provided a master measurement sensor 2*b* receiving measurement data from a pair of slave measurement sensors 2*a* and 2*c*, each sensor could in essence be a master measurement sensor in that it would have the capability to communicate with the control centre computer or with the DAC. Processing of the measurement data could then be carried out in the DAC or control centre computer. Each sensor could further receive information from adjacent sensors and generate accurate measurement data for that section of the medium voltage line. This is particularly the case in the embodiment in which a monitoring device is spread out over a fixed distance. Any one of the measurement sensors 2a, 2b and 2c could be provided with the capability to communicate directly with the DAC or control centre computer and to carry out the processing on the measurement data of each of the measurement sensors. By having the monitoring device spread out over this distance, up to 80-90% of the performance of the system having a master and two slave measurement sensors at each monitoring point, is achievable. This may be sufficient for the requirement of the electricity provider. The slight reduction in performance will be due to less accurate time synchronisation, as well as a difference in the capacitive loading between the two monitoring points. A loss of a few milliamps may also occur between adjacent sensors but this does not significantly affect the ability of the monitoring device to recognise a fault condition. Areas such as open ground beside motorways would not need the, most detailed resolution and 80-90% accuracy would be sufficient for their needs.

In the embodiment shown, the repair personnel were alerted using a pager and it will be understood that various other methods of altering the repair personnel such as by GSM network could be used. Furthermore, in the embodiment described it will be understood that each measurement unit will be electrically isolated from the overhead medium voltage line and therefore will be relatively simple to install on a line. Various different measurements can be taken from the overhead medium voltage lines by the addition of further measurement equipment. These could easily be incorporated into the measurement sensors.

In the embodiment described, foil plates 11 were used for electric field pickup to power the device when no current is flowing in the electric cables. These foil plates 11 may also be used to measure the voltage in the lines. The foil plates will yield very low power levels and, as an alternative to the foil plates, a super cap device, a rechargeable battery or a solar panel or battery may be used to power the device when no current is flowing in the electric cables. The exact construction of measurement sensor could, of course, be varied by altering the position of each of the layers or sections.

Furthermore, in each embodiment the measurement sensor is described as sending data to the control centre. It will be understood that this data will, in many cases, travel via a DAC and on a number of repeater units to amplify the signal. It is not absolutely necessary for the measurement unit to be in direct communication link with the control centre computer and any number of repeater units or other monitoring devices could be used to repeat the signal en route to the control centre computer. The position of each monitoring device/measurement sensor may be obtained, using standard GPS systems, when initially setting up the device. This may then in turn be used in whole or in part as the address of that particular unit as it will be unique to that unit. This will further help in directing engineers to particular faults in that GPS co-ordinates of a sensor could be given in remote areas which would facilitate further the ability of the service personnel to determine the location of a fault.

In this specification the terms "comprise, comprises, comprised and comprising" and the terms "include, includes, included and including" are deemed to be totally interchangeable and should be afforded the widest possible Interpretation.

The invention is in no way limited to the embodiment hereinbefore described but may be limited in both construction and detail within the scope of the claims.

The invention claimed is:

1. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network;

the monitoring device comprises three separate measurement sensors (2a, 2b, 2c), each measurement sensor being adapted for direct and electrically insulated connection onto a separate medium voltage overhead line (3a, 3b, 3c);

each measurement sensor having means to measure (4) the electrical properties of its respective medium voltage overhead line;

each measurement sensor having means to communicate (6) with at least one of the control centre computer and another measurement sensor, at least one of the measurement sensors having means to communicate with the control centre computer; and in which the three measurement sensors further comprise a master sensor and two slave sensors, each of the slave sensors having means to communicate data to and from the master sensor and the master sensor having means to communicate with the control centre computer.

2. A monitoring device (1) as claimed in claim 1, in which the master sensor further comprises a processor (5) for processing data received from each of the slave sensors before transmitting electrical properties data onwards to the control centre computer.

3. A monitoring device (1) as claimed in claim 1, in which each measurement sensor has a processor for processing the measured electrical properties of its respective medium voltage overhead line.

4. A monitoring device (1) as claimed in claim 1, in which there is provided means to synchronise the three measurement sensors (2a, 2b, 2c).

5. A monitoring device (1) as claimed in claim 1, in which each monitoring device has means to draw operating power directly from the magnetic field of the medium voltage overhead line.

6. A monitoring device (1) as claimed in claim 5 in which each measurement sensor has the means to draw operating power directly from the magnetic field of the medium voltage overhead line.

7. A monitoring device (1) as claimed in claim 6 in which the means to draw operating power directly from the magnetic field of the medium voltage overhead line comprises a magnetic field pick up coil.

8. A monitoring device (1) as claimed in claim 1 in which each measurement sensor has means to draw operating power directly from the electric field of the medium voltage overhead line.

9. A monitoring device (1) as claimed in claim 8 in which the means to draw operating power directly from the electric field of the medium voltage overhead line comprises foil plates for electric field pickup.

10. A monitoring device (1) as claimed in claim 1 in which each measurement sensor's means to measure the electrical properties of its associated medium voltage line further comprises a current measurement device.

11. A monitoring device (1) as claimed in claim 10 in which the current measurement device comprises a Rogowski coil.

12. A monitoring device (1) as claimed in claim 10 in which the current measurement device comprises a Hall effect device.

13. A monitoring device (1) as claimed in claim 10 in which the current measurement device comprises a current transformer constructed from a magnetically soft material.

14. A monitoring device (1) as claimed in claim 13 in which the current transformer further comprises means to draw operating power directly from the magnetic field of the medium voltage overhead line.

15. A monitoring device (1) as claimed in claim 1 in which each measurement sensor has means to measure one or more of the instantaneous current, ($I_C$), the peak current, ($I_{Pk}$), the root-mean square (RMS) current, ($I_{RMS}$), the harmonic content of the current, and the phase of the current in its associated medium voltage overhead line.

16. A monitoring device (1) as claimed in claim 15, in which each measurement sensor has means to calculate the phase element of the peak current using the formula:

$$I_p = \frac{1}{N} \cdot \sum_0^N f(n) \cdot \cos(\omega_0 n).$$

17. A monitoring device (1) as claimed in claim 15, in which each measurement sensor has means to calculate the quadrature element of the peak current using the formula:

$$I_q = \frac{1}{N} \cdot \sum_0^N f(n) \cdot \sin(\omega_0 n).$$

18. A monitoring device (1) as claimed in claim 1, in which any three adjacent measurement sensors may be combined to form arbitrary triplets to form a monitoring device.

19. A monitoring device (1) as claimed in claim 15, in which each measurement sensor has means to filter instantaneous current values and compare the instantaneous current values with peak current values for re-striking earth fault detection.

20. A monitoring device (1) as claimed in claim 15 in which each measurement sensor has means to compare the output of the sine/cosine functional block on a cycle by cycle basis with averaged values from the same source for detection of re-striking earth faults.

21. A monitoring device (1) as claimed in claim 15 in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

22. A monitoring device (1) as claimed in claim 21 in which the measurement device that has a means to receive the measurements from the other two devices further comprises means to perform one or more of the following operations:
(a) measure the RMS value of $I_G$,
(b) measure the amplitude and phase of $I_G$,
(c) measure the harmonic content of $I_G$,
(d) filter the $I_G$ signal,
(e) compare $I_G$ to a predetermined set of thresholds,
(f) determine the duration of an over-threshold condition and
(g) generate and transmit a status report to the control centre.

23. A monitoring device (1) as claimed in claim 1 in which each measurement sensor is provided with a slow discharge high capacitance capacitor to act as a temporary power supply.

24. A monitoring device (1) as claimed in claim 1 in which the means to communicate with the control centre computer comprises a radio transmitter/receiver.

25. A monitoring device (1) as claimed in claim 1 in which the three measurement sensors further comprise a master sensor and two slave sensors, the master sensor having means to communicate with the control centre, means to receive measurements from the slave sensors and a processor to process the measurements prior to transmission to the control centre.

26. A monitoring device (1) as claimed in claim 1 in which the monitoring device is provided with means to operate remote switch gear.

27. A monitoring device (1) as claimed in claim 5 in which the power supply of each of the measurement sensors is provided with a low loss full wave rectifier consisting of four transistors.

28. A monitoring device (1) as claimed in claim 5 in which each measurement sensor is provided with a shunt circuit to control the power being transferred to the measurement sensor.

29. A monitoring device (1) as claimed in claim 28 in which the shunt circuit further comprises an auxiliary winding to facilitate shunting.

30. A monitoring device (1) as claimed in claim 1 in which each measurement sensor samples the current flowing in its associated medium voltage line at a predetermined rate and there is provided means to synchronise the sampling rate of each of the three measurement sensors.

31. A monitoring device (1) as claimed in claim 30 in which the means to synchronise the sampling rate with the other measurement sensors comprises an analogue phase locked loop circuit.

32. A monitoring device (1) as claimed in claim 30 in which the means to synchronise the sampling rate with the other measurement sensors comprises a digital phase locked loop circuit.

33. A monitoring device (1) as claimed in claim 30 in which the means to synchronise the sampling rate with the other measurement sensors comprises a radio borne time signal.

34. A monitoring device (1) as claimed in claim 30 in which the means to synchronise the sampling rate with the other measurement sensors comprises a receiver on each of a pair of the measurement sensors to receive a transmitted synchronisation signal from the third measurement sensor.

35. A monitoring device (1) as claimed in claim 5 in which there is provided a boost regulator to provide adequate power supply integrity for circuitry of each measurement sensor.

36. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network;
the monitoring device comprises three separate measurement sensors (2a, 2b, 2c), each measurement sensor being adapted for direct and electrically insulated connection onto a separate medium voltage overhead line (3a, 3b, 3c);

each measurement sensor having means to measure (4) the electrical properties of its respective medium voltage overhead line;

each measurement sensor having means to communicate (6) with at least one of the control centre computer and another measurement sensor, at least one of the measurement sensors having means to communicate with the control centre computer;

the three measurement sensors further comprise a master sensor and two slave sensors, each of the slave sensors having means to communicate data to and from the master sensor and the master sensor having means to communicate with the control centre computer; and in which the master sensor further comprises a processor (5) for processing data received from each of the slave sensors before transmitting electrical properties data onwards to the control centre computer.

37. A monitoring device (1) as claimed in claim 36, in which each measurement sensor has a processor for processing the measured electrical properties of its respective medium voltage overhead line.

38. A monitoring device (1) as claimed in claim 36, in which there is provided means to synchronise the three measurement sensors (2a, 2b, 2c).

39. A monitoring device (1) as claimed in claim 36, in which each monitoring device has means to draw operating power directly from the magnetic field of the medium voltage overhead line.

40. A monitoring device (1) as claimed in claim 39 in which each measurement sensor has the means to draw operating power directly from the magnetic field of the medium voltage overhead line.

41. A monitoring device (1) as claimed in claim 40 in which the means to draw operating power directly from the magnetic field of the medium voltage overhead line comprises a magnetic field pick up coil.

42. A monitoring device (1) as claimed in claim 39 in which each measurement sensor has means to draw operating power directly from the electric field of the medium voltage overhead line.

43. A monitoring device (1) as claimed in claim 42 in which the means to draw operating power directly from the electric field of the medium voltage overhead line comprises foil plates for electric field pickup.

44. A monitoring device (1) as claimed in claim 36 in which each measurement sensor's means to measure the electrical properties of its associated medium voltage line further comprises a current measurement device.

45. A monitoring device (1) as claimed in claim 1 in which each measurement sensor has means to measure one or more of the instantaneous current, ($I_C$), the peak current, ($I_{Pk}$), the root-mean square (RMS) current, ($I_{RMS}$), the harmonic content of the current, and the phase of the current in its associated medium voltage overhead line.

46. A monitoring device (1) as claimed in claim 36, in which any three adjacent measurement sensors may be combined to form arbitrary triplets to form a monitoring device.

47. A monitoring device (1) as claimed in claim 45 in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

48. A monitoring device (1) as claimed in claim 47 in which the measurement device that has a means to receive the measurements from the other two devices further comprises means to perform one or more of the following operations:

(a) measure the RMS value of $I_G$,
(b) measure the amplitude and phase of $I_G$,
(c) measure the harmonic content of $I_G$,
(d) filter the $I_G$ signal,
(e) compare $I_G$ to a predetermined set of thresholds,
(f) determine the duration of an over-threshold condition and
(g) generate and transmit a status report to the control centre.

49. A monitoring device (1) as claimed in claim 36 in which the three measurement sensors further comprise a master sensor and two slave sensors, the master sensor having means to communicate with the control centre, means to receive measurements from the slave sensors and a processor to process the measurements prior to transmission to the control centre.

50. A monitoring device (1) as claimed in claim 36 in which each measurement sensor samples the current flowing in its associated medium voltage line at a predetermined rate and there is provided means to synchronise the sampling rate of each of the three measurement sensors.

51. A monitoring device (1) as claimed in claim 50 in which the means to synchronise the sampling rate with the other measurement sensors comprises a receiver on each of a pair of the measurement sensors to receive a transmitted synchronisation signal from the third measurement sensor.

52. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network, the monitoring device comprises three separate measurement sensors (2a, 2b, 2c), each measurement sensor being adapted for direct and electrically insulated connection onto a separate medium voltage overhead line (3a, 3b, 3c);

each measurement sensor having means to measure (4) the electrical properties of its respective medium voltage overhead line;

each measurement sensor having means to communicate (6) with at least one of the control centre computer and another measurement sensor, at least one of the measurement sensors having means to communicate with the control centre computer;

the three measurement sensors further comprise a master sensor and two slave sensors, each of the slave sensors having means to communicate data to and from the master sensor and the master sensor having means to communicate with the control centre computer;

each monitoring device has means to draw operating power directly from the magnetic field of the medium voltage overhead line; and each measurement sensor has means to draw operating power directly from the electric field of the medium voltage overhead line.

53. A monitoring device (1) as claimed in claim 52, in which the master sensor further comprises a processor (5) for processing data received from each of the slave sensors before transmitting electrical properties data onwards to the control centre computer.

54. A monitoring device (1) as claimed in claim 52, in which each measurement sensor has a processor for processing the measured electrical properties of its respective medium voltage overhead line.

55. A monitoring device (1) as claimed in claim 52, in which there is provided means to synchronise the three measurement sensors (2a, 2b, 2c).

56. A monitoring device (1) as claimed in claim 52 in which each measurement sensor
has the means to draw operating power directly from the magnetic field of the medium voltage overhead line.

57. A monitoring device (1) as claimed in claim 52 in which the means to draw operating power directly from the electric field of the medium voltage overhead line comprises foil plates for electric field pickup.

58. A monitoring device (1) as claimed in claim 52 in which each measurement sensor has means to measure one or more of the instantaneous current, ($I_C$), the peak current, ($I_{PK}$), the root-mean square (RMS) current, ($I_{RMS}$), the harmonic content of the current, and the phase of the current in its associated medium voltage overhead line.

59. A monitoring device (1) as claimed in claim 52, in which any three adjacent measurement sensors may be combined to form arbitrary triplets to form a monitoring device.

60. A monitoring device (1) as claimed in claim 58 in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

61. A monitoring device (1) as claimed in claim 60 in which the measurement device that has a means to receive the measurements from the other two devices further comprises means to perform one or more of the following operations:
(a) measure the RMS value of $I_G$,
(b) measure the amplitude and phase of $I_G$,
(c) measure the harmonic content of $I_G$,
(d) filter the $I_G$ signal,
(e) compare $I_G$ to a predetermined set of thresholds,
(f) determine the duration of an over-threshold condition and
(g) generate and transmit a status report to the control centre.

62. A monitoring device (1) as claimed in claim 52 in which each measurement sensor samples the current flowing in its associated medium voltage line at a predetermined rate and there is provided means to synchronise the sampling rate of each of the three measurement sensors.

63. A monitoring device (1) as claimed in claim 62 in which the means to synchronise the sampling rate with the other measurement sensors comprises a receiver on each of a pair of the measurement sensors to receive a transmitted synchronisation signal from the third measurement sensor.

64. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network,
the monitoring device comprises three separate measurement sensors (2a, 2b, 2c), each measurement sensor being adapted for direct and electrically insulated connection onto a separate medium voltage overhead line (3a, 3b, 3c);
each measurement sensor having means to measure (4) the electrical properties of its respective medium voltage overhead line;
each measurement sensor having means to communicate (6) with at least one of the control centre computer and another measurement sensor, at least one of the measurement sensors having means to communicate with the control centre computer;
the three measurement sensors further comprise a master sensor and two slave sensors, each of the slave sensors having means to communicate data to and from the master sensor and the master sensor having means to communicate with the control centre computer; and
each measurement sensor has means to measure one or more of the instantaneous current, ($I_C$), the peak current, ($I_{PK}$) the root-mean square (RMS) current, ($I_{RMS}$), the harmonic content of the current, and the phase of the current in its associated medium voltage overhead line.

65. A monitoring device (1) as claimed in claim 64, in which the master sensor further comprises a processor (5) for processing data received from each of the slave sensors before transmitting electrical properties data onwards to the control centre computer.

66. A monitoring device (1) as claimed in claim 64, in which each measurement sensor has a processor for processing the measured electrical properties of its respective medium voltage overhead line.

67. A monitoring device (1) as claimed in claim 64, in which there is provided means to synchronise the three measurement sensors (2a, 2b, 2c).

68. A monitoring device (1) as claimed in claim 64 in which each measurement sensor has the means to draw operating power directly from the magnetic field of the medium voltage overhead line.

69. A monitoring device (1) as claimed in claim 64 in which each measurement sensor has means to draw operating power directly from the electric field of the medium voltage overhead line.

70. A monitoring device (1) as claimed in claim 64, in which each measurement sensor has means to calculate the phase element of the peak current using the formula:

$$I_p = \frac{1}{N} \cdot \sum_0^N f(n) \cdot \cos(\omega_0 n).$$

71. A monitoring device (1) as claimed in claim 64, in which each measurement sensor has means to calculate the quadrature element of the peak current using the formula:

$$I_q = \frac{1}{N} \cdot \sum_0^N f(n) \cdot \sin(\omega_0 n).$$

72. A monitoring device (1) as claimed in claim 64, in which each measurement sensor has means to filter instantaneous current values and compare the instantaneous current values with peak current values for re-striking earth fault detection.

73. A monitoring device (1) as claimed in claim 64, in which each measurement sensor has means to compare the output of the sine/cosine functional block on a cycle by cycle basis with averaged values from the same source for detection of re-striking earth faults.

74. A monitoring device (1) as claimed in claim 64 in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

75. A monitoring device (1) as claimed in claim 74 in which the measurement device that has a means to receive the measurements from the other two devices further comprises means to perform one or more of the following operations:
    (a) measure the RMS value of $I_G$,
    (b) measure the amplitude and phase of $I_G$,
    (c) measure the harmonic content of $I_G$,
    (d) filter the $I_G$ signal,
    (e) compare $I_G$ to a predetermined set of thresholds,
    (f) determine the duration of an over-threshold condition and
    (g) generate and transmit a status report to the control centre.

76. A monitoring device (1) as claimed claim 64 in which each measurement sensor samples the current flowing in its associated medium voltage line at a predetermined rate and there is provided means to synchronise the sampling rate of each of the three measurement sensors.

77. A monitoring device (1) as claimed in claim 76 in which the means to synchronise the sampling rate with the other measurement sensors comprises a receiver on each of a pair of the measurement sensors to receive a transmitted synchronisation signal from the third measurement sensor.

78. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network;
    the monitoring device comprises three separate measurement sensors (2a, 2b, 2c), each measurement sensor being adapted for direct and electrically insulated connection onto a separate medium voltage overhead line (3a, 3b, 3c);
    each measurement sensor having means to measure (4) the electrical properties of its respective medium voltage overhead line;
    each measurement sensor having means to communicate (6) with at least one of the control centre computer and another measurement sensor, at least one of the measurement sensors having means to communicate with the control centre computer;
    the three measurement sensors further comprise a master sensor and two slave sensors, each of the slave sensors having means to communicate data to and from the master sensor and the master sensor having means to communicate with the control centre computer;
    and in which any three adjacent measurement sensors may be combined to form arbitrary triplets to form a monitoring device.

79. A monitoring device (1) as claimed in claim 78, in which the master sensor further comprises a processor (5) for processing data received from each of the slave sensors before transmitting electrical properties data onwards to the control centre computer.

80. A monitoring device (1) as claimed in claim 78, in which each measurement sensor has a processor for processing the measured electrical properties of its respective medium voltage overhead line.

81. A monitoring device (1) as claimed in claim 78, in which there is provided means to synchronise the three measurement sensors (2a, 2b, 2c).

82. A monitoring device (1) as claimed in claim 78, in which each measurement sensor has means to filter instantaneous current values and compare the instantaneous current values with peak current values for re-striking earth fault detection.

83. A monitoring device (1) as claimed in claim 78 in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

84. A monitoring device (1) as claimed in claim 83 in which the measurement device that has a means to receive the measurements from the other two devices further comprises means to perform one or more of the following operations:
    (a) measure the RMS value of $I_G$,
    (b) measure the amplitude and phase of $I_G$,
    (c) measure the harmonic content of $I_G$,
    (d) filter the $I_G$ signal,
    (e) compare $I_G$ to a predetermined set of thresholds,
    (f) determine the duration of an over-threshold condition and
    (g) generate and transmit a status report to the control centre.

85. A monitoring device (1) as claimed in claim 78 in which the three measurement sensors further comprise a master sensor and two slave sensors, the master sensor having means to communicate with the control centre, means to receive measurements from the slave sensors and a processor to process the measurements prior to transmission to the control centre.

86. A monitoring device (1) as claimed in claim 78 in which each measurement sensor samples the current flowing in its associated medium voltage line at a predetermined rate and there is provided means to synchronise the sampling rate of each of the three measurement sensors.

87. A monitoring device (1) as claimed in claim 86 in which the means to synchronise the sampling rate with the other measurement sensors comprises a receiver on each of a pair of the measurement sensors to receive a transmitted synchronisation signal from the third measurement sensor.

88. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network;
    the monitoring device comprises three separate measurement sensors (2a, 2b, 2c), each measurement sensor being adapted for direct and electrically insulated connection onto a separate medium voltage overhead line (3a, 3b, 3c);
    each measurement sensor having means to measure (4) the electrical properties of its respective medium voltage overhead line;
    each measurement sensor having means to communicate (6) with at least one of the control centre computer and another measurement sensor, at least one of the measurement sensors having means to communicate with the control centre computer;
    the three measurement sensors further comprise a master sensor and two slave sensors, each of the slave sensors having means to communicate data to and from the master sensor and the master sensor having means to communicate with the control centre computer;
    each measurement sensor has means to measure one or more of the instantaneous current, ($I_C$), the peak current, ($I_{Pk}$), the root-mean square (RMS) current, ($I_{RMS}$), the harmonic content of the current, and the phase of the current in its associated medium voltage overhead line; and in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

89. A monitoring device (1) as claimed in claim 88, in which the master sensor further comprises a processor (5) for processing data received from each of the slave sensors before transmitting electrical properties data onwards to the control centre computer.

90. A monitoring device (1) as claimed in claim 88, in which each measurement sensor has a processor for processing the measured electrical properties of its respective medium voltage overhead line.

91. A monitoring device (1) as claimed in claim 88, in which there is provided means to synchronise the three measurement sensors (2a, 2b, 2c).

92. A monitoring device (1) as claimed in claim 88, in which each measurement sensor has means to calculate the phase element of the peak current using the formula:

$$I_p = \frac{1}{N} \cdot \sum_0^N f(n) \cdot \cos(\omega_0 n).$$

93. A monitoring device (1) as claimed in claim 88, in which each measurement sensor has means to calculate the quadrature element of the peak current using the formula:

$$I_q = \frac{1}{N} \cdot \sum_0^N f(n) \cdot \sin(\omega_0 n).$$

94. A monitoring device (1) as claimed in claim 88, in which any three adjacent measurement sensors may be combined to form arbitrary triplets to form a monitoring device.

95. A monitoring device (1) as claimed in claim 88, in which each measurement sensor has means to filter instantaneous current values and compare the instantaneous current values with peak current values for re-striking earth fault detection.

96. A monitoring device (1) as claimed in claim 88 in which each measurement sensor has means to compare the output of the sine/cosine functional block on a cycle by cycle basis with averaged values from the same source for detection of re-striking earth faults.

97. A monitoring device (1) as claimed in claim 88 in which the measurement device that has a means to receive the measurements from the other two devices further comprises means to perform one or more of the following operations:
(a) measure the RMS value of $I_G$,
(b) measure the amplitude and phase of $I_G$,
(c) measure the harmonic content of $I_G$,
(d) filter the $I_G$ signal,
(e) compare $I_G$ to a predetermined set of thresholds,
(f) determine the duration of an over-threshold condition and
(g) generate and transmit a status report to the control centre.

98. A monitoring device (1) as claimed in claim 88 in which the three measurement sensors further comprise a master sensor and two slave sensors, the master sensor having means to communicate with the control centre, means to receive measurements from the slave sensors and a processor to process the measurements prior to transmission to the control centre.

99. A monitoring device (1) as claimed in claim 88 in which each measurement sensor samples the current flowing in its associated medium voltage line at a predetermined rate and there is provided means to synchronise the sampling rate of each of the three measurement sensors.

100. A monitoring device (1) as claimed in claim 99 in which the means to synchronise the sampling rate with the other measurement sensors comprises a receiver on each of a pair of the measurement sensors to receive a transmitted synchronisation signal from the third measurement sensor.

101. A monitoring device (1) for monitoring the electrical properties of a medium voltage overhead line (3) in a medium voltage network, the monitoring device comprising means to measure the electrical properties of the medium voltage line and means to communicate the measured electrical properties to a control centre computer of the medium voltage network;
the monitoring device comprises three separate measurement sensors (2a, 2b, 2c), each measurement sensor being adapted for direct and electrically insulated connection onto a separate medium voltage overhead line (3a, 3b, 3c);
each measurement sensor having means to measure (4) the electrical properties of its respective medium voltage overhead line;
each measurement sensor having means to communicate (6) with at least one of the control centre computer and another measurement sensor, at least one of the measurement sensors having means to communicate with the control centre computer;
in which the three measurement sensors further comprise a master sensor and two slave sensors, the master sensor having means to communicate with the control centre, means to receive measurements from the slave sensors and a processor to process the measurements prior to transmission to the control centre.

102. A monitoring device (1) as claimed in claim 101, in which each measurement sensor has a processor for processing the measured electrical properties of its respective medium voltage overhead line.

103. A monitoring device (1) as claimed in claim 101, in which there is provided means to synchronise the three measurement sensors (2a, 2b, 2c).

104. A monitoring device (1) as claimed in claim 101 in which each measurement sensor has the means to draw operating power directly from the magnetic field of the medium voltage overhead line.

105. A monitoring device (1) as claimed in claim 101 in which each measurement sensor has means to draw operating power directly from the electric field of the medium voltage overhead line.

106. A monitoring device (1) as claimed in claim 101 in which each measurement sensor has means to measure one or more of the instantaneous current, ($I_C$), the peak current, ($I_{Pk}$), the root-mean square (RMS) current, ($I_{RMS}$), the harmonic content of the current, and the phase of the current in its associated medium voltage overhead line.

107. A monitoring device (1) as claimed in claim 101, in which any three adjacent measurement sensors may be combined to form arbitrary triplets to form a monitoring device.

108. A monitoring device (1) as claimed in claim 106 in which one of the measurement sensors has means to receive the measurements from the other two measurement sensors and based on the received measurements and its own measured values has means to calculate one or more of the instantaneous balance current, $I_B$, the zero sequence current, $I_O$, and the ground current $I_G$.

109. A monitoring device (1) as claimed in claim 108 in which the measurement device that has a means to receive the measurements from the other two devices further comprises means to perform one or more of the following operations:
   (a) measure the RMS value of $I_G$,
   (b) measure the amplitude and phase of $I_G$,
   (c) measure the harmonic content of $I_G$,
   (d) filter the $I_G$ signal,
   (e) compare $I_G$ to a predetermined set of thresholds,
   (f) determine the duration of an over-threshold condition and
   (g) generate and transmit a status report to the control centre.

110. A monitoring device (1) as claimed in claim 101 in which each measurement sensor samples the current flowing in its associated medium voltage line at a predetermined rate and there is provided means to synchronise the sampling rate of each of the three measurement sensors.

111. A monitoring device (1) as claimed in claim 110 in which the means to synchronise the sampling rate with the other measurement sensors comprises a receiver on each of a pair of the measurement sensors to receive a transmitted synchronisation signal from the third measurement sensor.

112. A system for monitoring a medium voltage network comprising a plurality of medium voltage overhead lines, the system comprising a control centre computer (24) and a plurality of remote monitoring devices (1) distributed throughout the medium voltage network, each of the monitoring devices having means to measure the electrical properties of a medium voltage overhead line and means to communicate the measured electrical properties to the control centre computer, each monitoring device further comprises three measurement sensors (2a, 2b, 2c), each measurement sensor being mounted directly on a separate medium voltage overhead line (3a, 3b, 3c) to the other two measurement sensors and each measurement sensor having means to measure the electrical properties of its respective medium voltage line, each measurement sensor has communication means for communication with at least one of the control centre computer (24) and another measurement sensor, at least one of the measurement sensors having means to communicate with the control centre computer and in which the three measurement sensors further comprise a master sensor and two slave sensors, each of the slave sensors having means to communicate data to and from the master sensor and the master sensor having means to communicate with the control centre computer.

113. A system as claimed in claim 112 in which there are provided a plurality of Data Acquisition Communicators (DACs)(22) intermediate the control centre computer and the plurality of monitoring devices, each Data Acquisition Communicator having a plurality of monitoring devices associated therewith so that electrical properties data sent from a monitoring device to the control centre computer is sent to the relevant DAC (22) before being transferred from the relevant DAC to the control centre computer.

114. A system as claimed in claim 112 in which one of the measurement sensors further comprises a processor for processing the measured electrical signals from all three measurement sensors before transmitting the processed data to the control centre computer.

115. A system as claimed in claim 113, in which the DAC's are further provided with a processor to process the electrical properties data, prior to transmitting the data onwards to the control centre computer.

116. A system as claimed in claim 113 in which electrical properties data is sent from the DAC to the control centre computer over a GSM link.

117. A system as claimed in claim 113 in which there are provided repeaters intermediate a DAC and one or more of it's associated monitoring devices to amplify any communications to and from the DAC and the monitoring device.

118. A system as claimed in claim 115 in which each monitoring device may act as a repeater for another monitoring device in the system.

119. A system as claimed in claim 112 in which each of the measurement sensors is powered directly from the medium voltage line upon which it is mounted.

120. A system as claimed in claim 119 in which each measurement sensor has means to draw operating power directly from the magnetic field of the medium voltage overhead line.

121. A system as claimed in claim 119 in which the measurement sensors has means to draw operating power directly from the electrical field of the medium voltage overhead line.

122. A system as claimed in claim 112 in which the measured electrical signals are processed and in which the phase element of the peak current is calculated using the formula:

$$I_p = \frac{1}{N} \cdot \sum_0^N f(n) \cdot \cos(\omega_0 n).$$

123. A system as claimed in claim 112, in which the measured electrical signals are processed and in which the quadrature element of the peak current is calculated using the formula:

$$I_q = \frac{1}{N} \cdot \sum_0^N f(n) \cdot \sin(\omega_0 n).$$

124. A system as claimed in claim 112, in which any three adjacent measurement sensors may be combined to form arbitrary triplets to form a variety of detectors.

125. A system as claimed in claim 112, in which instantaneous current values are filtered and compared with typical peak values of current and these values are transmitted to the DAC for re-striking earth fault detection.

126. A system as claimed in claim 112, in which the output of the sine/cosine functional block is compared on a cycle by cycle basis with averaged values from the same source and the results of the comparison are transmitted to the DAC for detection of re-striking earth faults.

* * * * *